US010937952B2

(12) United States Patent
Lee et al.

(10) Patent No.: US 10,937,952 B2
(45) Date of Patent: Mar. 2, 2021

(54) SEMICONDUCTOR DEVICES INCLUDING STRESS-INDUCING LAYERS AND METHODS OF FORMING THE SAME

(71) Applicant: Samsung Electronics Co., Ltd., Suwon-si (KR)

(72) Inventors: Dong Kyu Lee, Hwasung-si (KR); Young Hyun Kim, Hwasung-si (KR); Jung Hwan Park, Hwasung-si (KR); Jung Min Lee, Hwasung-si (KR); Kyung Ii Hong, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 92 days.

(21) Appl. No.: 16/184,153

(22) Filed: Nov. 8, 2018

(65) Prior Publication Data

US 2019/0393410 A1 Dec. 26, 2019

(30) Foreign Application Priority Data

Jun. 26, 2018 (KR) .......................... 10-2018-0073291

(51) Int. Cl.
*H01L 43/10* (2006.01)
*H01L 27/22* (2006.01)
*H01L 43/02* (2006.01)
*H01L 43/08* (2006.01)

(52) U.S. Cl.
CPC ............ *H01L 43/10* (2013.01); *H01L 27/228* (2013.01); *H01L 43/02* (2013.01); *H01L 43/08* (2013.01)

(58) Field of Classification Search
None
See application file for complete search history.

(56) References Cited

U.S. PATENT DOCUMENTS

| 8,604,573 | B2 | 12/2013 | Yamakawa et al. |
| 9,000,545 | B2 | 4/2015 | Kajiyama |
| 9,236,565 | B2 | 1/2016 | Loong et al. |
| 9,373,782 | B2 | 6/2016 | Li et al. |
| 9,786,841 | B2 | 10/2017 | Siddik et al. |
| 2012/0218813 | A1* | 8/2012 | Oh .................... G11C 11/161 365/158 |
| 2013/0126996 | A1* | 5/2013 | Jeong ................ H01L 43/08 257/421 |
| 2014/0206104 | A1 | 7/2014 | Zhu et al. |
| 2014/0254250 | A1* | 9/2014 | Mani .................. H01L 43/08 365/158 |
| 2017/0271579 | A1 | 9/2017 | Kim |
| 2018/0287050 | A1* | 10/2018 | Madras ................ H01L 43/12 |
| 2019/0341542 | A1* | 11/2019 | Haq .................... H01L 43/12 |

FOREIGN PATENT DOCUMENTS

| JP | 2013-008868 A | 1/2013 |
| KR | 2013-0056013 A | 5/2013 |
| WO | WO-2017-052627 A1 | 3/2017 |
| WO | WO-2017-171747 A1 | 10/2017 |

* cited by examiner

*Primary Examiner* — Nduka E Ojeh
(74) *Attorney, Agent, or Firm* — Harness, Dickey & Pierce, P.L.C.

(57) ABSTRACT

A semiconductor device includes a first electrode disposed on a substrate, a magnetic tunnel junction (MTJ) on the first electrode, a capping layer on the MTJ, a stress-inducing layer on the capping layer, and a second electrode on the stress-inducing layer. The stress-inducing layer may have tensile stress.

18 Claims, 8 Drawing Sheets

US 10,937,952 B2

SEMICONDUCTOR DEVICES INCLUDING STRESS-INDUCING LAYERS AND METHODS OF FORMING THE SAME

CROSS-REFERENCE TO RELATED APPLICATION

This U.S. non-provisional patent application claims priority under 35 U.S.C. § 119 to and the benefit of Korean Patent Application No. 10-2018-0073291, filed on Jun. 26, 2018, in the Korean Intellectual Property Office (KIPO), the disclosure of which is incorporated herein by reference in its entirety.

BACKGROUND

1. Field

Example embodiments relate to semiconductor devices having one or more stress-inducing layers and methods of forming the semiconductor devices.

2. Description of Related Art

Research has been conducted into semiconductor memory devices that are advantageous for an increase in integration density and high-speed operations. With the requisition for these semiconductor memory devices, magnetoresistive random access memories (MRAMs) using a variation in resistance relative to a change in polarity of a magnetic material have been proposed. The MRAMs are encountering various difficulties, such as coercive force (Hc) errors and/or an increase in retention failure bits.

SUMMARY

Some example embodiments of the inventive concepts are directed to providing semiconductor devices capable of improving electrical properties and methods of forming the semiconductor devices.

According to some example embodiments, a semiconductor device may include a first electrode on a substrate, a magnetic tunnel junction (MTJ) on the first electrode, a capping layer on the MTJ, a stress-inducing layer on the capping layer, and a second electrode on the stress-inducing layer. The stress-inducing layer may have tensile stress.

According to some example embodiments, a semiconductor device may include a lower interconnecting wire on a substrate, an upper interconnecting wire on the lower interconnecting wire, such that the upper interconnecting wire extends over and across the lower interconnecting wire, a magnetic tunnel junction (MTJ) between the lower interconnecting wire and the upper interconnecting wire, a first electrode between the lower interconnecting wire and the MTJ, a capping layer between the MTJ and the upper interconnecting wire, a stress-inducing layer between the capping layer and the upper interconnecting wire, and a second electrode between the stress-inducing layer and the upper interconnecting wire. The stress-inducing layer may have tensile stress.

According to some example embodiments, a semiconductor device may include a first electrode on a substrate, a magnetic tunnel junction (MTJ) on the first electrode, a capping layer on the MTJ, a stress-inducing layer on the capping layer, and a second electrode on the stress-inducing layer. The capping layer may include a metal oxide. The stress-inducing layer may include a titanium nitride layer having tensile stress and a thickness of about 4 nm to about 10 nm. The second electrode may include a titanium nitride layer having a greater thickness than a thickness of the stress-inducing layer. A side surface of the second electrode, a side surface of the stress-inducing layer, a side surface of the capping layer, and a side surface of the MTJ may be substantially coplanar with each other.

According to some example embodiments, a method of forming a semiconductor device may include forming a first electrode layer on a substrate, forming a magnetic tunnel junction (MTJ) on the first electrode layer, forming a capping layer on the MTJ, forming a stress-inducing layer on the capping layer, the stress-inducing layer having tensile stress, annealing the stress-inducing layer and the MTJ, forming a second electrode layer on the stress-inducing layer, and patterning the second electrode layer, the stress-inducing layer, the capping layer, the MTJ, and the first electrode layer.

DETAILED DESCRIPTION OF EXAMPLE EMBODIMENTS

Figure 1:
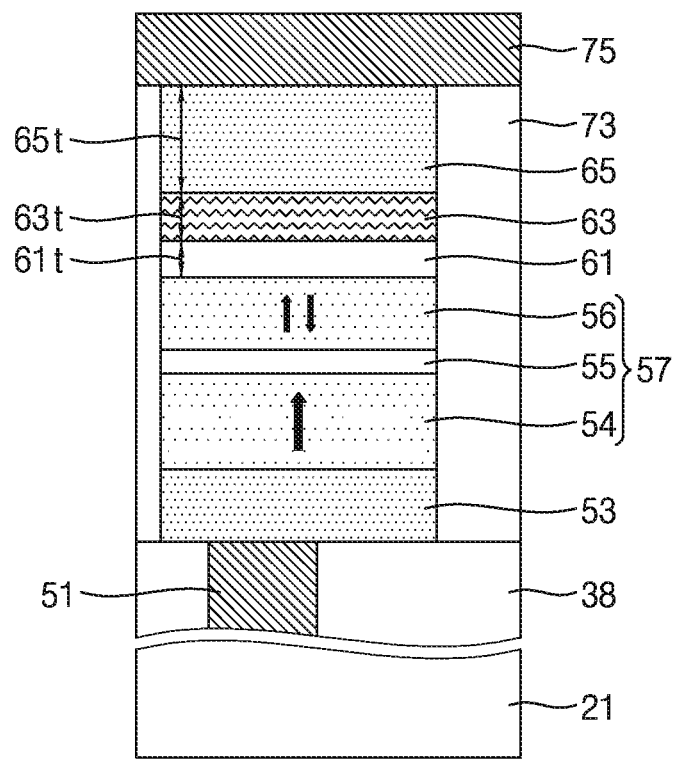
FIG. 1 is a cross-sectional view illustrating a semiconductor device according to some example embodiments.

FIG. 1 is a cross-sectional view illustrating a semiconductor device according to some example embodiments. The semiconductor device according to some example embodiments may include a non-volatile memory device, such as a magnetoresistive random access memory (MRAM) or a cross-point (X-point) memory. In some example embodiments, the semiconductor device may include an embedded MRAM (eMRAM). In some example embodiments, the semiconductor device may include a perpendicular magnetic tunnel junction-spin transfer torque-MRAM (pMTJ-STT-MRAM).

Referring to FIG. 1, the semiconductor device according to some example embodiments may include a substrate 21, an interlayer insulating layer 38, a lower plug 51, a first electrode 53, a magnetic tunnel junction (MTJ) 57, a capping layer 61, a stress-inducing layer 63, a second electrode 65, an upper insulating layer 73, and an upper interconnecting wire 75. The MTJ 57 may include a reference layer 54, a tunnel barrier layer 55, and a storage layer 56.

In FIG. 1, the first electrode 53 is on the substrate 21, the MTJ 57 is on the first electrode 53, the capping layer 61 is on the MTJ 57, the stress-inducing layer 63 is on the capping layer 61, and the second electrode 65 is on the stress-inducing layer 63. As described herein, an element that is "on" another element may be above or beneath the other element. Additionally, an element that is on another element may be "directly" on the other element (e.g., first electrode 53 may be directly on interlayer insulating layer 38) and/or may be "indirectly" on the other element such that one or more interposing elements and/or spaces isolate the element from direct contact with the other element (e.g., the first electrode 53 may be indirectly on the substrate 21 such that at least the interlayer insulating layer 38 interposes between the first electrode 53 and substrate 21. The first electrode 53 may be connected to the lower plug 51. As shown in FIG. 1, the first electrode 53 may have a greater width than that of the lower plug 51. The first electrode 53 may include titanium (Ti), titanium nitride (TiN), tantalum (Ta), tantalum nitride (TaN), tungsten (W), tungsten nitride (WN), a sub-combination thereof, or a combination thereof. For example, the first electrode 53 may include a TiN layer. The MTJ 57 may be disposed on the first electrode 53. Each of the reference layer 54 and the storage layer 56 may include at least one ferromagnetic layer, such as cobalt iron boron (CoFeB). The tunnel barrier layer 55 may include a metal oxide, such as magnesium oxide (MgO). The capping layer 61 may cover the MTJ 57. The capping layer 61 may be in direct contact with a top surface of the MTJ 57. The capping layer 61 may include a dielectric layer, such as a ruthenium oxide (RuO) layer. The capping layer 61 may include a metal oxide, such as magnesium oxide (MgO), ruthenium oxide (RuO), vanadium oxide (VO), tungsten oxide (WO), tantalum oxide (TaO), hafnium oxide (HfO), molybdenum oxide (MoO), a sub-combination thereof, or a combination thereof.

The stress-inducing layer 63 may cover the capping layer 61. As shown in FIG. 1, the stress-inducing layer 63 may be interposed between the capping layer 61 and the second electrode 65. As further shown in FIG. 1, a bottom surface of the stress-inducing layer 63 may be in direct contact with a top surface of the capping layer 61. A top surface of the stress-inducing layer 63 may be in direct contact with a bottom surface of the second electrode 65. As shown in FIG. 1, a thickness 63$t$ of the stress-inducing layer 63 may be greater than a thickness 61$t$ of the capping layer 61. As further shown in FIG. 1, a thickness 63$t$ of the stress-inducing layer 63 may be less than a thickness 65$t$ of the second electrode 65.

The stress-inducing layer 63 may include a conductive layer having tensile stress, such that the stress-inducing layer 63 has tensile stress. The stress-inducing layer 63 may include a metal nitride, such as TiN, TaN, WN, a sub-combination thereof, or a combination thereof. In some example embodiments, the stress-inducing layer 63 may be a TiN layer. The stress-inducing layer 63 may exhibit a tensile stress of about 1 GPa to about 4 GPa. The stress-inducing layer 63 may have a density of about 5 g/cm$^3$ to about 15 g/cm$^3$. The stress-inducing layer 63 may have a sheet resistance Rs of about 450 Ω/☐ (ohm/sq) to about 600Ω/☐. The stress-inducing layer 63 may have a thickness 63$t$ of about 4 nm to about 60 nm. In some example embodiments, the stress-inducing layer 63 may have a thickness 63$t$ of about 4 nm to about 10 nm. In some example embodiments, the stress-inducing layer 63 may have a thickness 63$t$ of about 5 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The second electrode 65 may cover the stress-inducing layer 63. The second electrode 65 may include Ti, TiN, Ta, TaN, W, WN, a sub-combination thereof, or a combination thereof. For instance, the second electrode 65 may include a TiN layer. As shown in FIG. 1, a side surface of the second electrode 65, a side surface of the stress-inducing layer 63, a side surface of the capping layer 61, a side surface of the MTJ 57, and a side surface of the first electrode 53 may be substantially coplanar with each other (e.g., coplanar with each other within manufacturing tolerances and/or material tolerances). The upper interconnecting wire 75 may be disposed on the second electrode 65. The upper interconnecting wire 75 may correspond to a bit line or be connected to the bit line.

A magnetic polarization of the reference layer 54 may be fixed. A magnetic polarization of the storage layer 56 may be changed due to a switching current applied to the MTJ 57 through the first electrode 53 and the second electrode 65. When the reference layer 54 and the storage layer 56 have a parallel magnetic polarization, the MTJ 57 may be in a low-resistance state. When the reference layer 54 and the storage layer 56 have an anti-parallel magnetic polarization, the MTJ 57 may be in a high-resistance state. A non-volatile memory device may be implemented using a spin polarized current of the MTJ 57. The stress-inducing layer 63 may serve to improve electrical properties of the MTJ 57, thereby improving performance of the semiconductor device as shown in FIG. 1.

FIGS. 2 to 12 are cross-sectional views illustrating a method of forming a semiconductor device, according to some example embodiments.

Figure 2:
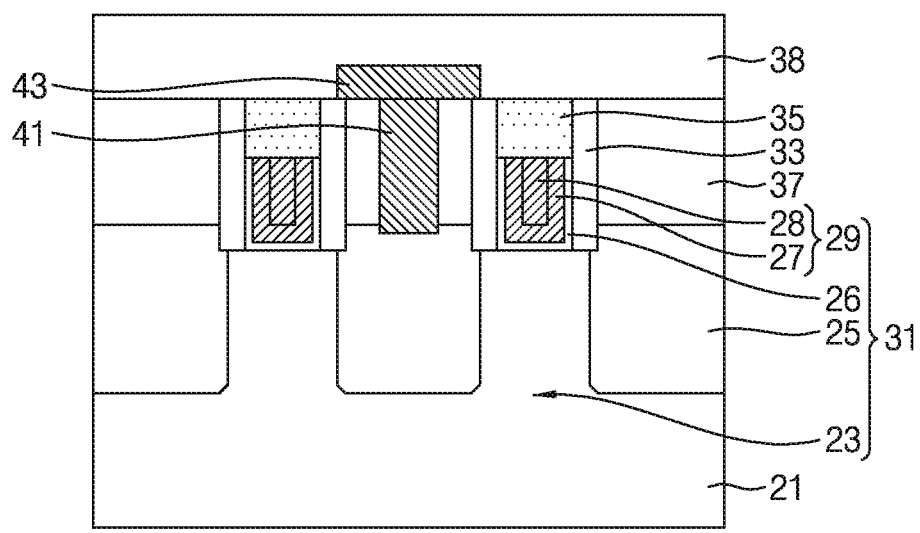
FIGS. 2, 3, 4, 5, 6, 7, 8, 9, 10, 11, and 12 are cross-sectional views illustrating a method of forming a semiconductor device, according to some example embodiments.

Referring to FIG. 2, a switching element 31, a lower insulating layer 37, an interlayer insulating layer 38, a source plug 41, and a source line 43 may be formed on a substrate 21. The switching element 31 may include an active region 23, source and drain regions 25, a gate dielectric layer 26, and a gate electrode 29. The gate electrode 29 may include a work-function conductive layer 27 and a gate conductive layer 28. Gate spacers 33 may be formed on side surfaces of the gate electrode 29. A gate capping pattern 35 may be formed on the gate electrode 29.

In some example embodiments, the active region 23 may include a fin active region. The switching element 31 may be a fin-field effect transistor (FinFET). In some example embodiments, the switching element 31 may include a planar transistor, a recess channel array transistor (RCAT), a vertical transistor, a nanowire transistor, a multi-bridge channel (MBC) transistor, a three-dimensional (3D) transistor, a diode, a sub-combination thereof, or a combination thereof.

The substrate 21 may include a semiconductor substrate, such as a silicon wafer or a silicon-on-insulator (SOI) wafer. The active region 23 may be confined to one surface of the substrate 21. In some example embodiments, the active region 23 may include a single-crystalline silicon layer having p-type impurities. The source and drain regions 25 may be formed adjacent to both sides of the gate electrode 29. The source and drain regions 25 may have a different conductive type from that of the active region 23. For example, the source and drain regions 25 may include a semiconductor layer having n-type impurities, which is formed using a selective epitaxial growth (SEG) process. Upper ends of the source and drain regions 25 may protrude at a higher level than a bottom surface of the gate electrode 29.

The gate electrode 29 may correspond to a word line. The gate electrode 29 may include a metal, a metal nitride, a metal silicide, a conductive carbon, polysilicon (poly-Si), a sub-combination thereof, or a combination thereof. In some example embodiments, the gate electrode 29 may correspond to a replacement gate. The gate electrode 29 may cover a top surface and side surfaces of the active region 23.

The gate dielectric layer 26 may be interposed between the gate electrode 29 and the active region 23. The gate dielectric layer 26 may cover a bottom surface and the side surfaces of the gate electrode 29. The gate dielectric layer 26 may include silicon oxide, silicon nitride, silicon oxynitride, a high-k dielectric material, a sub-combination thereof, or a combination thereof.

The gate spacers 33 may cover the side surfaces of the gate electrode 29 and side surfaces of the gate capping pattern 35. The gate spacers 33 may include silicon oxide, silicon nitride, silicon oxynitride, a low-k dielectric material, a sub-combination thereof, or a combination thereof. The gate capping pattern 35 may be aligned with the gate electrode 29 on the gate electrode 29. The gate capping pattern 35 may include silicon oxide, silicon nitride, silicon oxynitride, a low-k dielectric material, a sub-combination thereof, or a combination thereof. In some example embodiments, the gate spacers 33 and the gate capping pattern 35 may include silicon nitride.

The lower insulating layer 37 may cover the source and drain regions 25. Top surfaces of the lower insulating layer 37, the gate capping pattern 35, and the gate spacer 33 may be substantially coplanar with each other (e.g., coplanar with each other within manufacturing tolerances and/or material tolerances). The interlayer insulating layer 38 may cover the lower insulating layer 37, the gate capping pattern 35, and the gate spacers 33. The lower insulating layer 37 and the interlayer insulating layer 38 may include silicon oxide, silicon nitride, silicon oxynitride, low-k dielectric material, a sub-combination thereof, or a combination thereof.

The source plug 41 may be formed through the lower insulating layer 37 and connected to a corresponding one of the source and drain regions 25. The source line 43 may be disposed in the interlayer insulating layer 38 and connected to the source plug 41. The source plug 41 and the source line 43 may include a metal, a metal nitride, a metal silicide, a conductive carbon, poly-Si, a sub-combination thereof, or a combination thereof.

Figure 3:
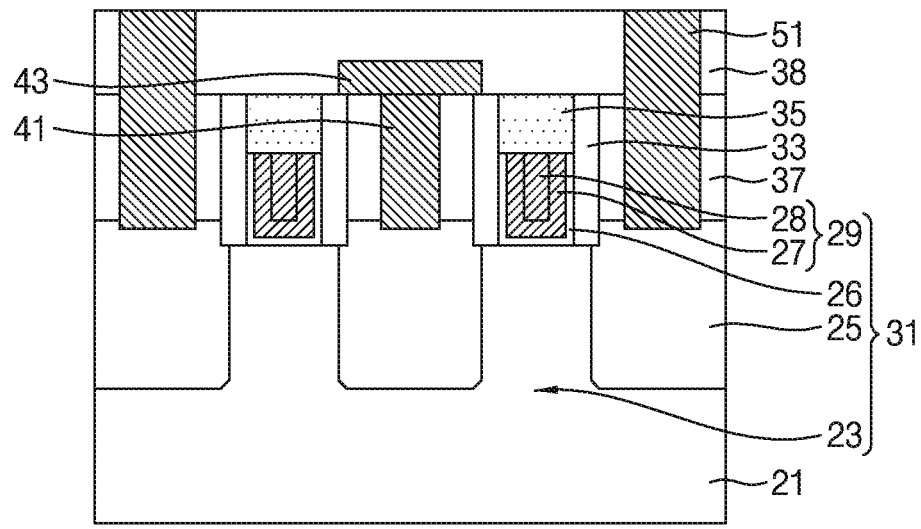

Referring to FIG. 3, a lower plug 51 may be formed through the interlayer insulating layer 38 and the lower insulating layer 37 and connected to a corresponding one of the source and drain regions 25. The lower plug 51 may include a metal, a metal nitride, a metal silicide, a conductive carbon, poly-Si, a sub-combination thereof, or a combination thereof. Top surfaces of the interlayer insulating layer 38 and the lower plug 51 may be exposed to be substantially the same planar surface (e.g., the same planar surface within manufacturing tolerances and/or material tolerances).

Figure 4:
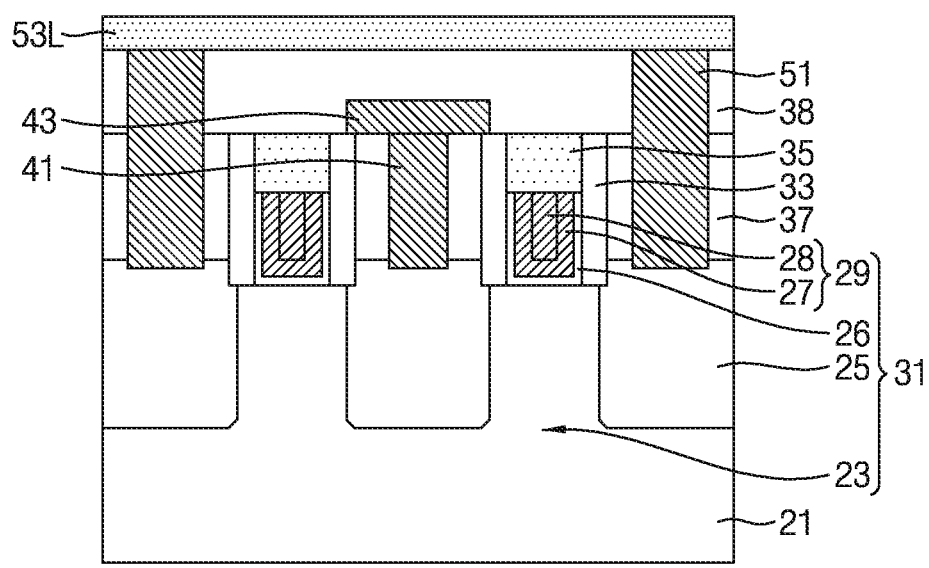

Referring to FIG. 4, a first electrode layer 53L may be formed on the substrate 21 to cover the interlayer insulating layer 38. A bottom surface of the first electrode layer 53L may be in direct contact with the lower plug 51. The first electrode layer 53L may include Ti, TiN, Ta, TaN, W, WN, a sub-combination thereof, or a combination thereof. For example, the first electrode layer 53L may include a TiN layer. The first electrode layer 53L may cover one surface of the substrate 21.

Figure 5:
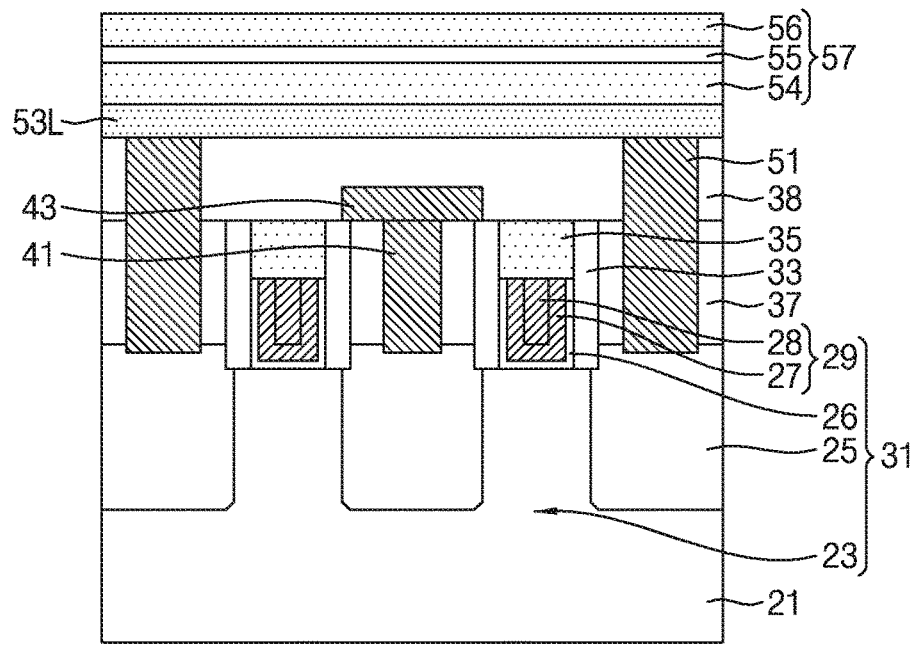

Referring to FIG. 5, an MTJ 57 may be formed on the first electrode layer 53L. The MTJ 57 may include a reference layer 54, a tunnel barrier layer 55, and a storage layer 56, which are sequentially stacked. In some example embodiments, the reference layer 54 may be interposed between the first electrode layer 53L and the storage layer 56. In some example embodiments, the storage layer 56 may be interposed between the first electrode layer 53L and the reference layer 54.

The reference layer 54 may include at least one ferromagnetic layer, such as a CoFeB layer. The reference layer 54 may include a seed layer, a pinned layer, a fixed layer, a sub-combination thereof, or a combination thereof. In some example embodiments, the reference layer 54 may include at least one synthetic antiferromagnetic (SAF) structure. The SAF structure may include two magnetic layers and a spacer layer interposed between the two magnetic layers. For instance, the SAF may include a CoFeB layer, a Ru layer, and a CoFe layer, which are sequentially stacked.

The tunnel barrier layer 55 may be formed between the reference layer 54 and the storage layer 56. The tunnel barrier layer 55 may include a metal oxide, such as magnesium oxide (MgO), ruthenium oxide (RuO), vanadium oxide (VO), tungsten oxide (WO), tantalum oxide (TaO), hafnium oxide (HfO), molybdenum oxide (MoO), a sub-combination thereof, or a combination thereof. For example, the tunnel barrier layer 55 may be a MgO layer. The storage layer 56 may include at least one ferromagnetic layer, such as a CoFeB layer. The storage layer 56 may include a free layer. The storage layer 56 may include at least one SAF structure. The SAF structure may include two magnetic layers and a spacer layer interposed between the two magnetic layers.

Figure 6:
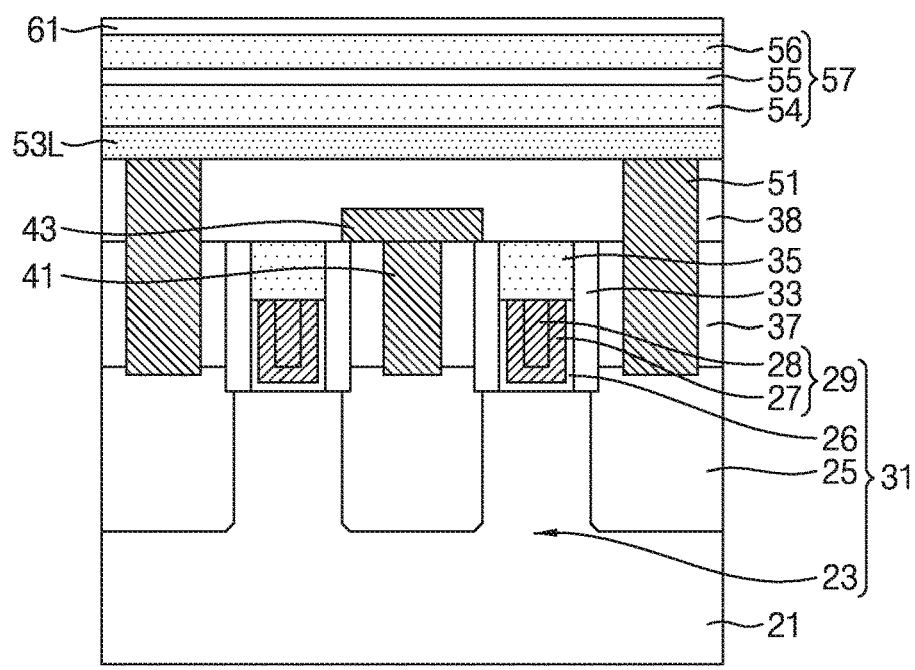

Referring to FIG. 6, a capping layer 61 may be formed on the MTJ 57 to cover the MTJ 57. The capping layer 61 may include a metal oxide, such as RuO, MgO, VO, WO, TaO, HfO, MoO, a sub-combination thereof, or a combination thereof. For example, the capping layer 61 may be a RuO layer.

Figure 7:
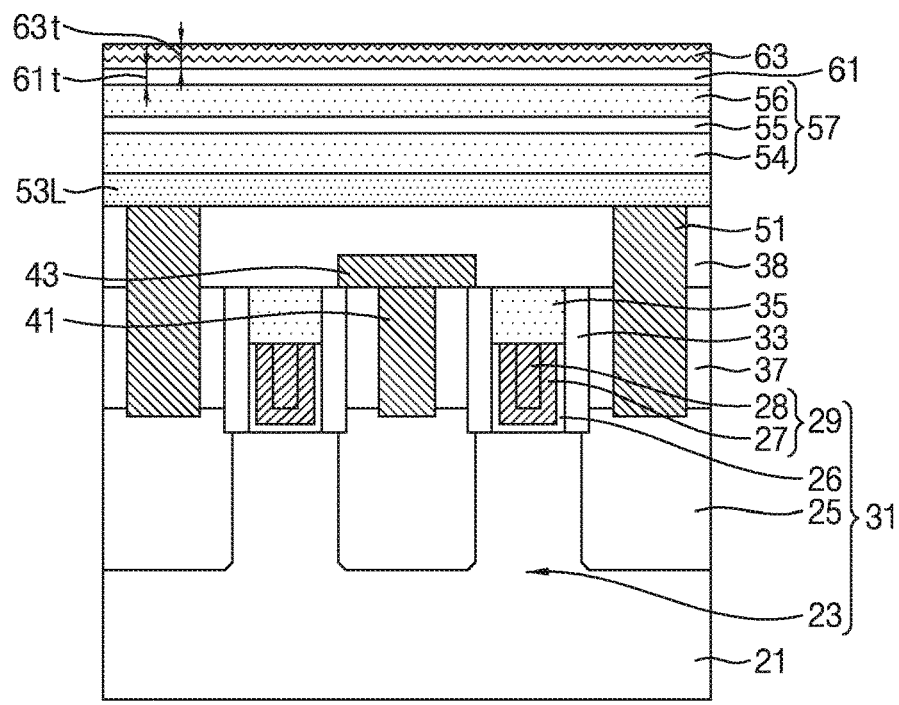

Referring to FIG. 7, a stress-inducing layer 63 may be formed on the capping layer 61. The stress-inducing layer 63 may be in direct contact with a top surface of the capping layer 61. The stress-inducing layer 63 may exhibit tensile stress. In some example embodiments, a thickness 63t of the stress-inducing layer 63 may be greater than a thickness 61t of the capping layer 61. The stress-inducing layer 63 may be formed using a physical vapor deposition (PVD) process, an atomic layer deposition (ALD) process, a chemical vapor deposition (CVD) process, a cyclic CVD process, a sub-combination thereof, or a combination thereof. For example, the stress-inducing layer 63 may be formed using a PVD process. The stress-inducing layer 63 may include a metal nitride, such as TiN, TaN, WN, a sub-combination thereof, or a combination thereof.

In some example embodiments, the stress-inducing layer 63 may be a TiN layer. The stress-inducing layer 63 may have a thickness 63t of about 4 nm to about 60 nm. The stress-inducing layer 63 may have a density of about 5 g/cm$^3$ to about 15 g/cm$^3$. The density of the stress-inducing layer 63 may be measured by using X-ray reflectometry (XRR). The stress-inducing layer 63 may exhibit a tensile stress of about 1 GPa to about 4 GPa. The stress-inducing layer 63 may have a sheet resistance Rs of about 450 Ω/□ to about 600 Ω/□. In some example embodiments, the stress-inducing layer 63 may have a thickness 63t of about 4 nm to about 10 nm. In some example embodiments, the stress-inducing layer 63 may have a thickness 63t of about 5 nm.

Figure 8:
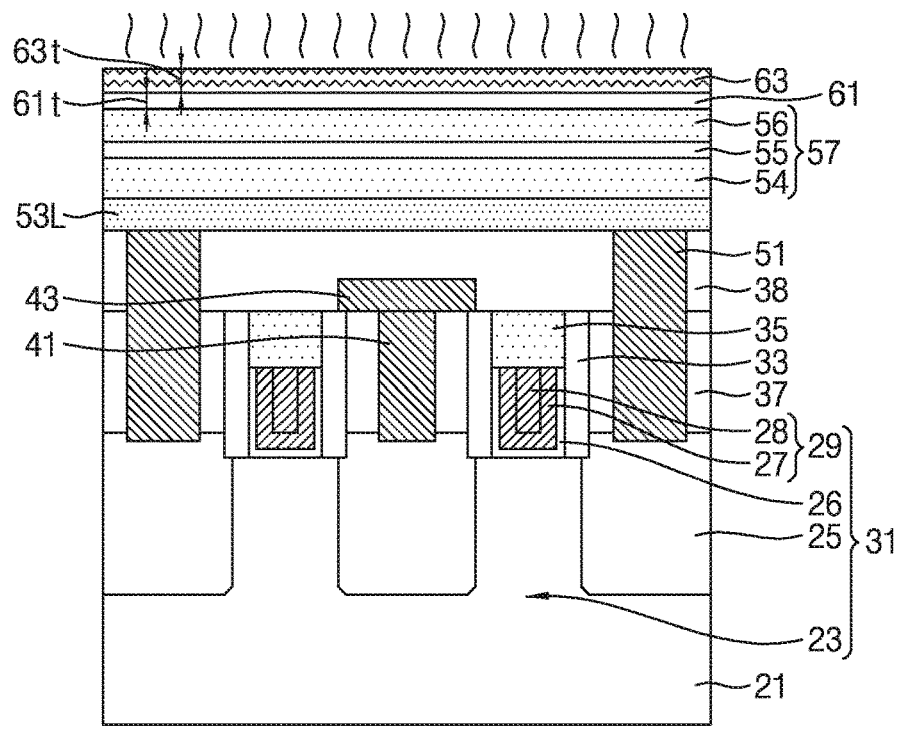

Referring to FIG. 8, after the stress-inducing layer 63 is formed, an annealing process to crystallize the MTJ 57 may be performed. The annealing process may be performed in a vacuum atmosphere or low-pressure atmosphere at a temperature of about 350° C. to about 400° C. for about 50 to about 70 minutes. For example, the annealing process to crystallize the MTJ 57 may include annealing the substrate 21 having the stress-inducing layer 63 and the MTJ 57 in a vacuum atmosphere or low-pressure atmosphere at a temperature of about 375° C. for about 1 hour.

Figure 9:
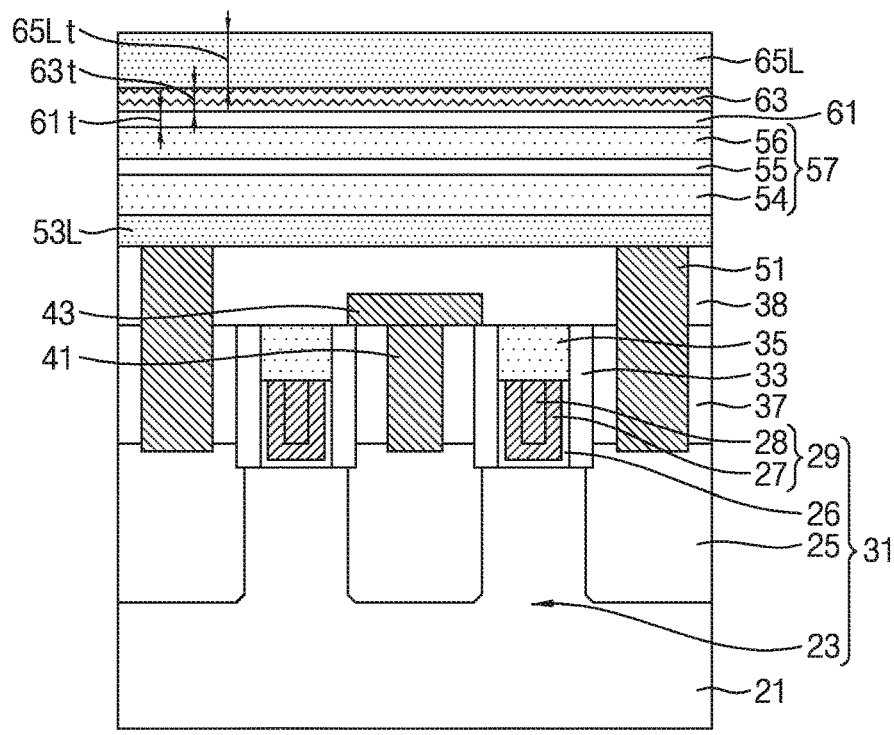

Referring to FIG. 9, after the annealing process to crystallize the MTJ 57 is performed, a second electrode layer 65L may be formed on the stress-inducing layer 63. Restated, the annealing of the stress-inducing layer 63 and the MTJ 57 may be performed before the forming of the second electrode layer 65L. The second electrode layer 65L may include Ti, TiN, Ta, TaN, W, WN, a sub-combination thereof, or a combination thereof. For example, the second electrode layer 65L may include a TiN layer. The second electrode layer 65L may cover the stress-inducing layer 63. A thickness 63t of the stress-inducing layer 63 may be less than a thickness 65Lt of the second electrode layer 65L and greater than a thickness 61t of the capping layer 61.

Figure 10:
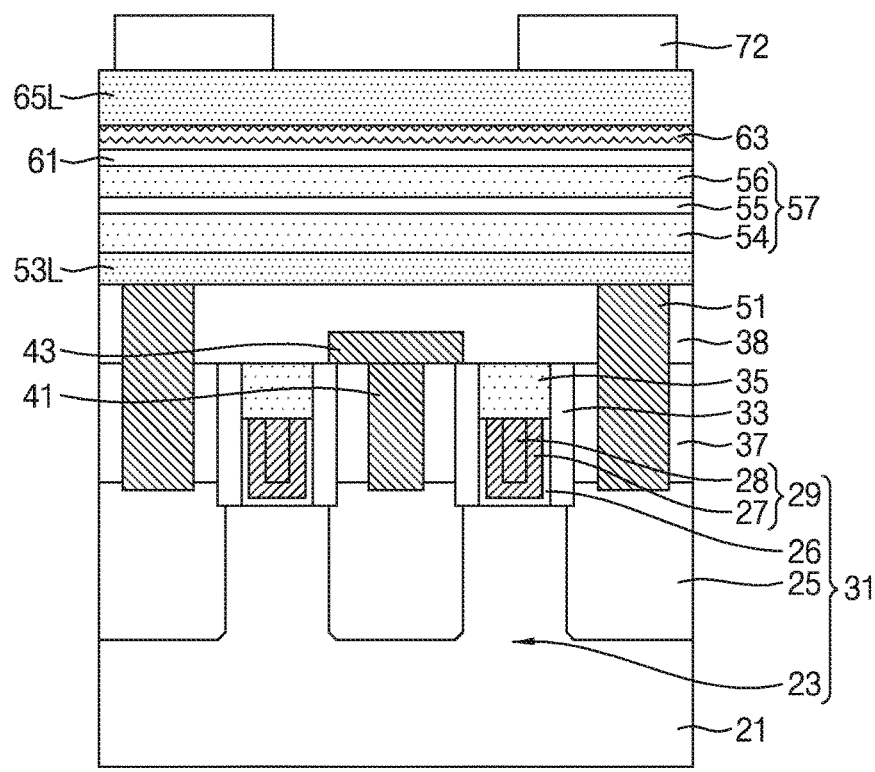

Referring to FIG. 10, a mask pattern 72 may be formed on the second electrode layer 65L. The mask pattern 72 may include a photoresist pattern, a hard mask pattern, a sub-combination thereof, or a combination thereof.

Figure 11:
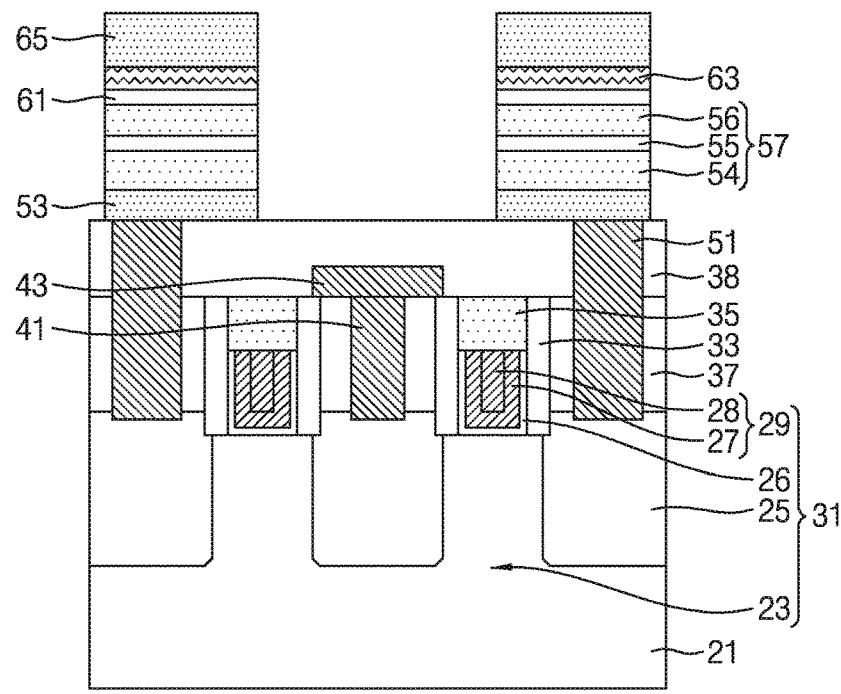

Referring to FIG. 11, the second electrode layer 65L, the stress-inducing layer 63, the capping layer 61, the MTJ 57, and the first electrode layer 53L may be patterned to form a plurality of first electrodes 53 and a plurality of second electrodes 65. The stress-inducing layer 63, the capping layer 61, and the MTJ 57 may be retained between the plurality of first electrodes 53 and the plurality of second electrodes 65. The mask pattern 72 may be removed. During the patterning process, the plurality of second electrodes 65 may serve as hard masks. Although the plurality of second electrodes 65 may also be partially etched during the patterning process and have a reduced thickness, a description thereof will be omitted for brevity.

Figure 12:
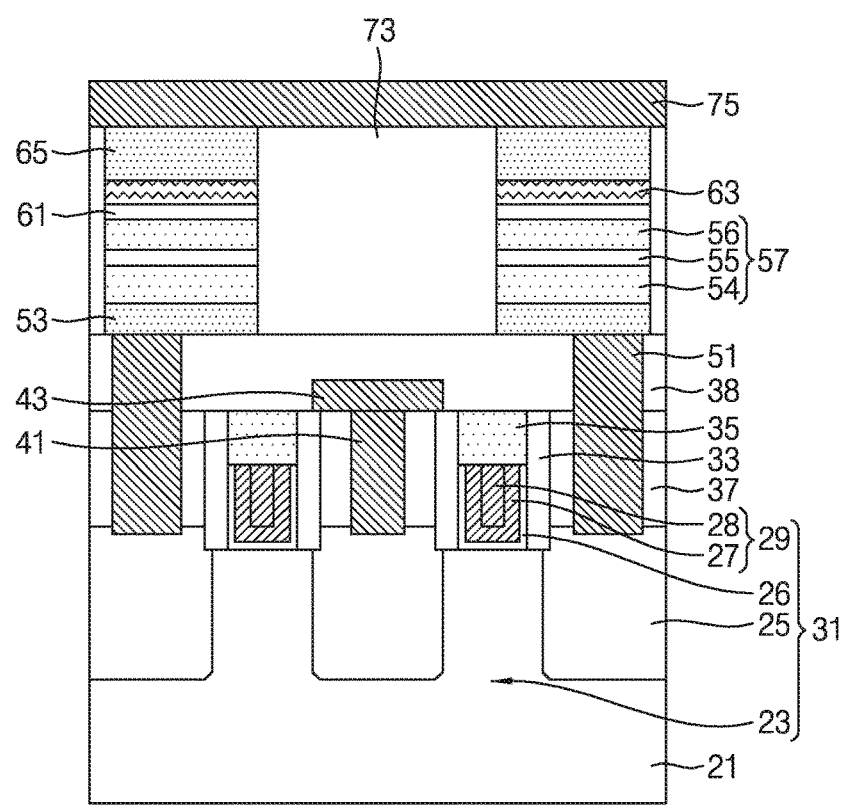

Referring to FIG. 12, an upper insulating layer 73 and an upper interconnecting wire 75 may be formed. The upper insulating layer 73 may cover the interlayer insulating layer 38 and fill spaces between the plurality of first electrodes 53 and spaces between the plurality of second electrodes 65. A top surface of the upper insulating layer 73 and top surfaces of the plurality of second electrodes 65 may be substantially coplanar with each other (e.g., coplanar with each other within manufacturing tolerances and/or material tolerances). The upper insulating layer 73 may include silicon oxide, silicon nitride, silicon oxynitride, a low-k dielectric material, a sub-combination thereof, or a combination thereof. The upper interconnecting wire 75 may be formed on the upper insulating layer 73 and the plurality of second electrodes 65. The upper interconnecting wire 75 may include a metal, a metal nitride, a metal silicide, a conductive carbon, a sub-combination thereof, or a combination thereof.

In experimental examples, the stress-inducing layer 63 may be formed to a thickness 63t of about 4 nm to about 10 nm (e.g., a TiN layer having a thickness of about 5 nm). To crystallize the MTJ 57, the stress-inducing layer 63 and the MTJ 57 may be annealed in a vacuum chamber at a temperature of about 375° C. for about 1 hour. The stress-inducing layer 63 may exhibit a tensile stress of about 1 GPa to about 4 GPa. The stress-inducing layer 63 may have a density of about 5 g/cm$^3$ to about 15 g/cm$^3$. The stress-inducing layer 63 may have a sheet resistance Rs of about 450 Ω/□ to about 600 Ω/□. The semiconductor device having the stress-inducing layer 63 and the MTJ 57 may have excellent electrical properties. For example, in the semiconductor device having the stress-inducing layer 63 and the MTJ 57, a coercive force Hc of a flat panel may be increased by about 20%, a coercive force of a pattern cell may be increased by about 15%, a switching current Isw may be improved, retention failure bits may be reduced, and a lifespan may be increased.

Figure 13:
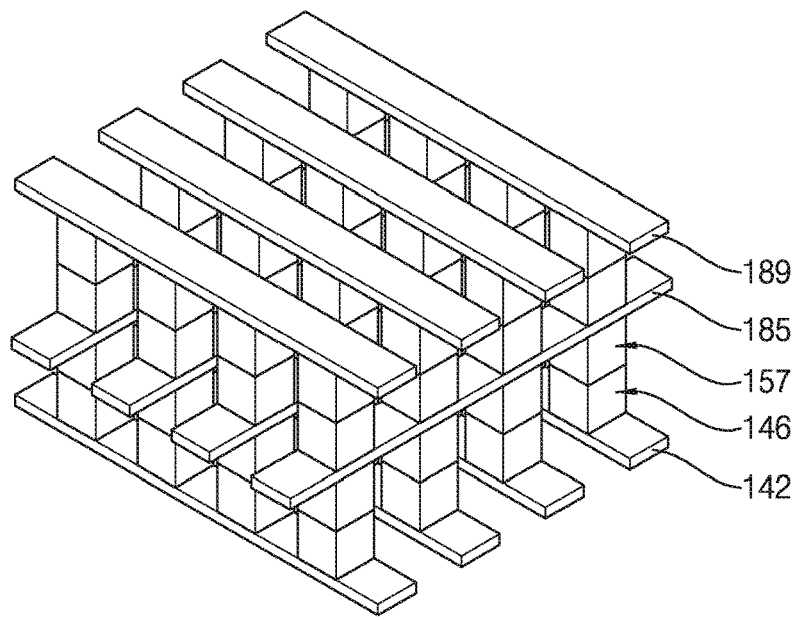
FIG. 13 is a perspective view illustrating a semiconductor device, according to some example embodiments.
Figure 14:
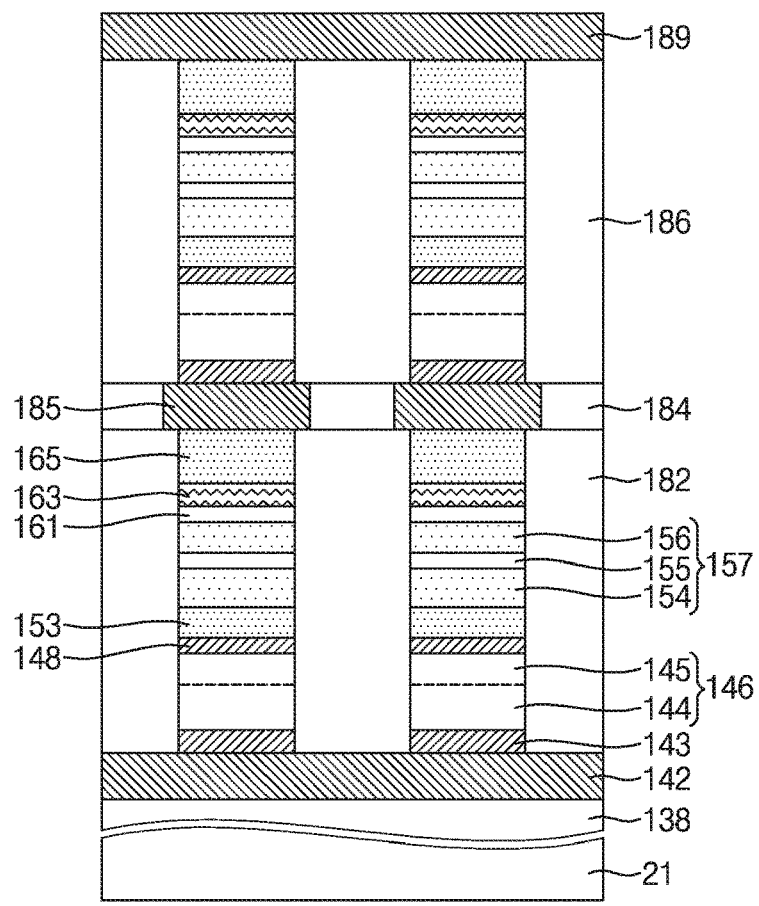
FIG. 14 is a cross-sectional view illustrating a semiconductor device according to some example embodiments.

FIG. 13 is a perspective view illustrating a semiconductor device according to some example embodiments, and FIG. 14 is a cross-sectional view of the semiconductor device of FIG. 13.

Referring to FIGS. 13 and 14, the semiconductor device according to some example embodiments may include a substrate 21, an interlayer insulating layer 138, a plurality of lower interconnecting wires 142, a first insulating layer 182, a second insulating layer 184, a plurality of middle interconnecting wires 185, a third insulating layer 186, and a plurality of upper interconnecting wires 189. The interlayer insulating layer 138 may cover the substrate 21. The plurality of lower interconnecting wires 142 may be two-dimensionally arranged to be parallel to each other on the interlayer insulating layer 138. The plurality of middle interconnecting wires 185 may be two-dimensionally arranged to be parallel to each other and run across and over the plurality of lower interconnecting wires 142. The plurality of upper interconnecting wires 189 may be two-dimensionally arranged to be parallel to each other and run across and over the plurality of middle interconnecting wires 185.

As shown in FIG. 14, a lower switching electrode 143, a switching element 146, an upper switching electrode 148, a first electrode 153, an MTJ 157, a capping layer 161, a stress-inducing layer 163, and a second electrode 165 may be sequentially stacked on each of intersections between the plurality of lower interconnecting wires 142 and the plurality of middle interconnecting wires 185 and intersections between the plurality of middle interconnecting wires 185 and the plurality of upper interconnecting wires 189. The switching element 146 may include a first semiconductor layer 144 and a second semiconductor layer 145. The MTJ 157 may include a reference layer 154, a tunnel barrier layer 155, and a storage layer 156.

The lower switching electrode 143 may be formed between the plurality of lower interconnecting wires 142 and the switching element 146 and between the plurality of middle interconnecting wires 185 and the switching element 146. As shown in FIG. 14, the switching element 146 may be between a lower interconnecting wire 142 and a first electrode 153 or between a middle interconnecting wire 185 and a second electrode 165. The switching element 146 may be connected to the plurality of lower interconnecting wires 142 or the plurality of middle interconnecting wires 185 through the lower switching electrode 143. The switching element 146 may include a diode. In some example embodiments, the first semiconductor layer 144 may include a p-type semiconductor layer, and the second semiconductor layer 145 may include an n-type semiconductor layer. The upper switching electrode 148 may be formed between the switching element 146 and the first electrode 153.

Each of the plurality of lower interconnecting wires 142, the lower switching electrode 143, the upper switching electrode 148, the plurality of middle interconnecting wires 185, and the plurality of upper interconnecting wires 189 may include a metal, a metal nitride, a metal silicide, poly-Si, a conductive carbon, a sub-combination thereof, or a combination thereof. Each of the interlayer insulating layer 138, the first insulating layer 182, the second insulating layer 184, and the third insulating layer 186 may include silicon oxide, silicon nitride, silicon oxynitride, a low-k dielectric material, a sub-combination thereof, or a combination thereof. The first electrode 153, the MTJ 157, the capping layer 161, the stress-inducing layer 163, and the second electrode 165 may be similar to those described with reference to FIGS. 1 to 12. For example, the stress-inducing layer 163 may include titanium nitride. In some example embodiments, the stress-inducing layer 163 and the second electrode 165 may each include a separate titanium nitride layer. The stress-inducing layer 163 may have a thickness of about 4 nm to about 10 nm. The stress-inducing layer may have a tensile stress of about 1 GPa to about 4 GPa. The capping layer 161 may include a dielectric layer, and the stress-inducing layer 163 may include a conductive layer. The second electrode 165 may be connected to the plurality of middle interconnecting wires 185 or the plurality of upper interconnecting wires 189.

In some example embodiments, a semiconductor device may include a lower interconnecting wire 142 on a substrate 21, a middle interconnecting wire 185 (which may be referred to as an upper interconnecting wire) on the lower interconnecting wire 142 such that the middle interconnecting wire 185 crosses the lower interconnecting wire 142 (e.g., extends over and across the lower interconnecting wire 142), an MTJ 157 between the lower interconnecting wire 142 and the middle interconnecting wire 185, a first electrode 153 between the lower interconnecting wire 142 and the MTJ 157, a capping layer 161 between the MTJ 157 and the middle interconnecting wire 185, a stress-inducing layer 163 between the capping layer 161 and the middle interconnecting wire 185, and a second electrode 165 between the stress-inducing layer 163 and the middle interconnecting wire 185.

As shown in FIG. 14, a side surface of the second electrode 165, a side surface of the stress-inducing layer 163, a side surface of the capping layer 161, a side surface of the MTJ 157, and a side surface of the first electrode 153 may be substantially coplanar with each other (e.g., coplanar with each other within manufacturing tolerances and/or material tolerances).

In some example embodiments, the lower switching electrode 143, the switching element 146, and the upper switching electrode 148 may be disposed between the second electrode 165 and the plurality of middle interconnecting wires 185 or between the second electrode 165 and the plurality of upper interconnecting wires 189.

In some example embodiments, the plurality of lower interconnecting wires 142 and the plurality of upper interconnecting wires 189 may correspond to a plurality of bit lines, and the plurality of middle interconnecting wires 185 may correspond to a plurality of word lines. The plurality of lower interconnecting wires 142 and the plurality of upper interconnecting wires 189 may correspond to a plurality of word lines, and the plurality of middle interconnecting wires 185 may correspond to a plurality of bit lines. The plurality of middle interconnecting wires 185 may be interpreted as a plurality of lower interconnecting wires or a plurality of upper interconnecting wires.

Figure 15:
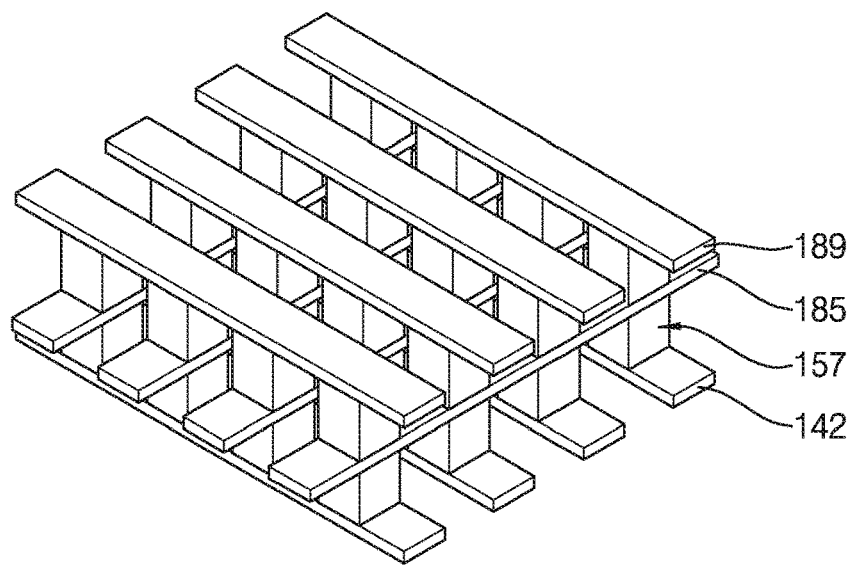
FIG. 15 is a perspective view illustrating a semiconductor device according to some example embodiments.
Figure 16:
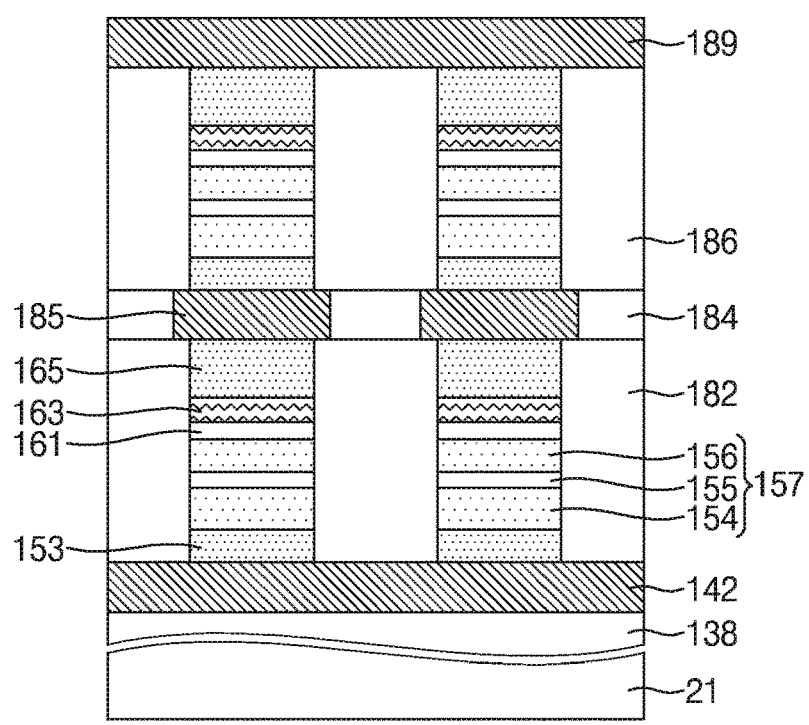
FIG. 16 is a cross-sectional view illustrating a semiconductor device according to some example embodiments.

FIG. 15 is a perspective view illustrating a semiconductor device according to some example embodiments, and FIG. 16 is a cross-sectional view illustrating the semiconductor device of FIG. 15.

Referring to FIGS. 15 and 16, the semiconductor device according to some example embodiments may include a substrate 21, an interlayer insulating layer 138, a plurality of lower interconnecting wires 142, a first insulating layer 182, a second insulating layer 184, a plurality of middle interconnecting wires 185, a third insulating layer 186, and a plurality of upper interconnecting wires 189.

As shown in FIG. 16, a first electrode 153, an MTJ 157, a capping layer 161, a stress-inducing layer 163, and a second electrode 165 may be sequentially stacked on each of intersections between the plurality of lower interconnecting wires 142 and the plurality of middle interconnecting wires 185 and intersections between the plurality of middle interconnecting wires 185 and the plurality of upper interconnecting wires 189. The first electrode 153 may be in direct contact with the plurality of lower interconnecting wires 142 or the plurality of middle interconnecting wires 185. The first electrode 153, the MTJ 157, the capping layer 161, the stress-inducing layer 163, and the second electrode 165 may be similar to those described with reference to FIGS. 1 to 14.

According to some example embodiments of the inventive concepts, a capping layer having a dielectric layer can be formed on an MTJ. A stress-inducing layer having tensile stress can be formed on the capping layer. An annealing process for crystallizing the MTJ can be performed. Electrical properties of the MTJ can be markedly improved. A semiconductor device having excellent electrical properties can be implemented.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:
1. A semiconductor device, comprising:
a first electrode on a substrate;
a magnetic tunnel junction (MTJ) on the first electrode, the MTJ including
a reference layer on the first electrode,
a tunnel barrier layer on the reference layer, and
a storage layer on the tunnel barrier layer, such that the tunnel barrier layer is between the reference layer and the storage layer;
a capping layer on the MTJ, the capping layer including a metal oxide;
a stress-inducing layer on the capping layer, the stress-inducing layer having tensile stress; and
a second electrode on the stress-inducing layer,
wherein the stress-inducing layer is between the capping layer and the second electrode,
wherein the stress-inducing layer includes a metal nitride.
2. The semiconductor device of claim 1, wherein a side surface of the second electrode, a side surface of the stress-inducing layer, a side surface of the capping layer, and a side surface of the MTJ are substantially coplanar with each other.
3. The semiconductor device of claim 1, wherein the stress-inducing layer is in direct contact with the capping layer and the second electrode.
4. The semiconductor device of claim 1, wherein a thickness of the stress-inducing layer is less than a thickness of the second electrode.
5. The semiconductor device of claim 1, wherein a thickness of the stress-inducing layer is greater than a thickness of the capping layer.
6. The semiconductor device of claim 1, wherein the stress-inducing layer includes titanium nitride.
7. The semiconductor device of claim 1, wherein a thickness of the stress-inducing layer is between about 4 nm to about 10 nm.
8. The semiconductor device of claim 1, wherein the stress-inducing layer has a density of about 5 $g/cm^3$ to about 15 $g/cm^3$.

9. The semiconductor device of claim 1, wherein the stress-inducing layer has a sheet resistance of about 450Ω/□ to about 600Ω/□.

10. The semiconductor device of claim 1, wherein the stress-inducing layer has a tensile stress of about 1 GPa to about 4 GPa.

11. The semiconductor device of claim 1, wherein the capping layer includes ruthenium oxide, magnesium oxide, vanadium oxide, tungsten oxide, tantalum oxide, hafnium oxide, molybdenum oxide, a sub-combination thereof, or a combination thereof.

12. The semiconductor device of claim 1, wherein the second electrode includes titanium nitride, tantalum nitride, tungsten nitride, a sub-combination thereof, or a combination thereof.

13. A semiconductor device, comprising:
a lower interconnecting wire on a substrate;
an upper interconnecting wire on the lower interconnecting wire, such that the upper interconnecting wire extends over and across the lower interconnecting wire;
a magnetic tunnel junction (MTJ) between the lower interconnecting wire and the upper interconnecting wire, the MTJ including
a reference layer,
a tunnel barrier layer on the reference layer, and
a storage layer on the tunnel barrier layer, such that the tunnel barrier layer is between the reference layer and the storage layer;
a first electrode between the lower interconnecting wire and the MTJ;
a capping layer between the MTJ and the upper interconnecting wire, the capping layer including a metal oxide;
a stress-inducing layer between the capping layer and the upper interconnecting wire, the stress-inducing layer having tensile stress; and
a second electrode between the stress-inducing layer and the upper interconnecting wire,
wherein the stress-inducing layer is between the capping layer and the second electrode,
wherein the stress-inducing layer includes a metal nitride.

14. The semiconductor device of claim 13, wherein
the capping layer includes a dielectric layer, and
the stress-inducing layer includes a conductive layer.

15. The semiconductor device of claim 13, wherein a side surface of the second electrode, a side surface of the stress-inducing layer, a side surface of the capping layer, and a side surface of the MTJ are substantially coplanar with each other.

16. The semiconductor device of claim 13, wherein
the stress-inducing layer includes titanium nitride having a thickness of about 4 nm to about 10 nm,
the stress-inducing layer has a tensile stress of about 1 GPa to about 4 GPa.

17. The semiconductor device of claim 13, further comprising:
a switching element between the lower interconnecting wire and the first electrode or between the upper interconnecting wire and the second electrode.

18. A semiconductor device, comprising:
a first electrode on a substrate;
a magnetic tunnel junction (MTJ) on the first electrode, the MTJ including
a reference layer on the first electrode,
a tunnel barrier layer on the reference layer, and
a storage layer on the tunnel barrier layer, such that the tunnel barrier layer is between the reference layer and the storage layer;
a capping layer on the MTJ, the capping layer including a metal oxide;
a stress-inducing layer on the capping layer, the stress-inducing layer including a first titanium nitride layer having tensile stress and a thickness of about 4 nm to about 10 nm; and
a second electrode on the stress-inducing layer, the second electrode including a second titanium nitride layer having a greater thickness than a thickness of the stress-inducing layer,
wherein a side surface of the second electrode, a side surface of the stress-inducing layer, a side surface of the capping layer, and a side surface of the MTJ are substantially coplanar with each other,
wherein the stress-inducing layer is between the capping layer and the second electrode.

* * * * *